(12) United States Patent  (10) Patent No.: US 7,663,459 B2
Horstmann  (45) Date of Patent: Feb. 16, 2010

(54) SHORT-CIRCUIT INDICATOR FOR ELECTRICAL LINES FOR POWER DISTRIBUTION

(75) Inventor: Hendrik Horstmann, Ratingen (DE)

(73) Assignee: Dipl.-Ing. H. Horstmann GmbH (DE)

( * ) Notice: Subject to any disclaimer, the term of this patent is extended or adjusted under 35 U.S.C. 154(b) by 0 days.

(21) Appl. No.: 12/144,541

(22) Filed: Jun. 23, 2008

(65) Prior Publication Data
US 2009/0009274 A1 Jan. 8, 2009

(30) Foreign Application Priority Data
Jul. 2, 2007 (DE) .................. 20 2007 009 240 U

(51) Int. Cl.
*H01F 21/02* (2006.01)
*H01F 38/20* (2006.01)
*H01F 17/06* (2006.01)
*G01R 15/18* (2006.01)
(52) U.S. Cl. .................. 336/30; 336/174; 336/176; 324/127
(58) Field of Classification Search .................. None
See application file for complete search history.

(56) References Cited
U.S. PATENT DOCUMENTS
4,456,873 A * 6/1984 Schweitzer, Jr. ............ 324/543
4,513,273 A * 4/1985 Friedl ........................... 336/55
5,180,972 A * 1/1993 Schweitzer, Jr. ............ 324/127
5,483,215 A * 1/1996 Mies ........................... 336/176
5,729,125 A * 3/1998 Schweitzer, Jr. ............ 324/127
6,963,197 B1 * 11/2005 Feight et al. ................. 324/126

* cited by examiner

*Primary Examiner*—Elvin G Enad
*Assistant Examiner*—Mangtin Lian
(74) *Attorney, Agent, or Firm*—Davis M. Chin, Jr.; Davis Chin

(57) ABSTRACT

A short-circuit indicator is provided for arrangement on an electrical line for electrical power distribution which includes a current transformer. The current transformer has an induction coil and an iron yoke for surrounding the electrical line to be monitored for a short-circuit current. The induction coil is seated on a base web of a U-shaped first yoke part. A second yoke part is connected in the form of a joint which can move between a closed position and an open position to one of two U-limbs of the first yoke part. The second yoke part forms a magnetic return path element for the first yoke part in the closed position. The first yoke part is split into two essentially L-shaped parts in the area of the base web to which the induction coil is fitted.

19 Claims, 4 Drawing Sheets

SHORT-CIRCUIT INDICATOR FOR ELECTRICAL LINES FOR POWER DISTRIBUTION

BACKGROUND OF THE INVENTION

1. Field of the Invention

The present invention relates to a short-circuit indicator for arrangement on an electrical line for electrical power distribution, having a current transformer which has an induction coil with an iron yoke for surrounding the respective line to be monitored for a short-circuit current, with the induction coil being seated on a base web of a U-shaped first yoke part, and with a second yoke part being connected in the form of a joint which can move between a closed position and an open position to one of two U-limbs of the first yoke part, as a magnetic return path element.

2. Description of the Prior Art de 43 31 265 C2 describes a corresponding current transformer. In this case, the U-shaped first yoke part together with the induction coil to be fitted to its base web leads to a difficult and therefore costly production process, because the U-shaped yoke part must have the induction coil wound on it directly in a winding process. This requires special process and apparatus measures, because of the U-limbs which project from the base web at both ends. In the case of the known current transformer, the second yoke part—referred to there as the magnetic return path iron bar—is also likewise U-shaped and is held via a hinge in the free end area of the U-limb of the first yoke part such that it can pivot, in the area of its bend points, that is to say in the transitional area between an L-web and an adjacent U-limb. The hinge, which is prefabricated as a separate component, is connected to the yoke parts by means of rivets. This also leads to a high level of manufacturing effort.

SUMMARY OF THE INVENTION

The present invention is based on the object of improving a short-circuit indicator and a current transformer of this generic type such that it can be produced more easily and thus more economically.

According to the invention, this is achieved by the features of claim 1. Advantageous refinement features of the invention are the subject matter of the dependent claims. Furthermore, protection is also claimed for the major components (as spares) for the short-circuit indicator, to be precise for the current transformer and its specific iron yoke.

Accordingly, a first significant factor according to the invention is that the first yoke part is split in the area of the base web to which the induction coil is fitted such that it comprises two essentially L-shaped parts. It is therefore advantageously possible to prefabricate the induction coil separately by winding the coil wire on a suitable coil former, which is prefabricated in particular as a plastic moulding. This winding of the coil former is very much simpler than direct winding of the U-shaped yoke part. All that is then required for assembly is to insert one L-web of each of the L-shaped parts of the first yoke part into the coil or the coil former from opposite sides. They then preferably rest directly parallel on one another over virtually their entire length, which is advantageous for the magnetic characteristics.

The first yoke part expediently comprises a flat iron bar in the form of a strip. In this case, provision is made, to be precise in addition to or as an alternative to (independently) the subject matter of claim 1, for the base web to which the induction coil is fitted to have a width which is less than the width of the adjacent U-limbs. This means that the induction coil can advantageously also have a correspondingly reduced width, and therefore a small cross section. This results in the particular advantage that the induction coil is lighter and therefore cheaper. This is because the operation of the short-circuit indicator and of the current transformer depends only on the number of turns of the induction coil, so that less winding wire (reduced wire length) is required because of the reduced coil cross section. The reduction in size and weight that is achieved in consequence also leads to a reduction in the material, transportation and storage costs. Furthermore, the reduced physical size of the induction coil within a housing which holds the induction coil for the short-circuit indicator creates free space which can advantageously be used to accommodate other components. In this case, it is particularly advantageous for the reduced-width base web of the first yoke part to be formed asymmetrically with respect to a centre plane which is defined by the longitudinal centre axes of the U-limbs, to be precise preferably such that the U-limbs and the base web each have a side edge lying on a common side plane. This creates a free space mainly on one side alongside the induction coil, although this is considerably larger than in the case of an embodiment in which the reduced-width base web is formed symmetrically with respect to the centre plane. The larger free space can also be used to accommodate larger components, such as an elongated, for example cylindrical, battery which can then be accommodated parallel alongside the induction coil.

In a further advantageous refinement, the second yoke part also comprises a flat iron bar in the form of a strip, to be precise with a width which corresponds to the width of the U-limbs of the first yoke part. In this case, the second yoke part is designed to clasp the respective line, likewise approximately in a U-shape or C-shape. In this case, the second yoke part is connected by a joint to the free end area of the U-limb of the first yoke part in a transitional area between a web and one of two adjacent limbs. This refinement, which corresponds essentially to the initially cited DE 43 31 265 C2, means that the free limb of the second yoke part projects, in its open position, into the line holding area formed by the first yoke part. On fitting to the line, this limb of the second yoke part then comes into contact with the line, thus resulting in an automatic pivoting movement of the second yoke part to its closed position as it is fitted further over this limb which rests on the line. The line is then pressed against the second yoke part by spring force by means of contact-pressure elements, so that the second yoke part is held in the closed position. It can be opened with an opposite pivoting movement against the spring force.

However, the invention now provides in this case for the joint to be formed exclusively by uniform-material sections of the yoke parts, so that there is no longer any need to prefabricate and fit any additional hinge. This also contributes to a simple and economic production capability. Details relating to this advantageous refinement will be explained in the following more detailed description.

BRIEF DESCRIPTION OF THE DRAWINGS

The invention will be explained in more detail in the following text with reference to the drawings and to one preferred exemplary embodiment, which is illustrated in the drawings, in which.

DESCRIPTION OF THE PREFERRED EMBODIMENTS

Figure 1:
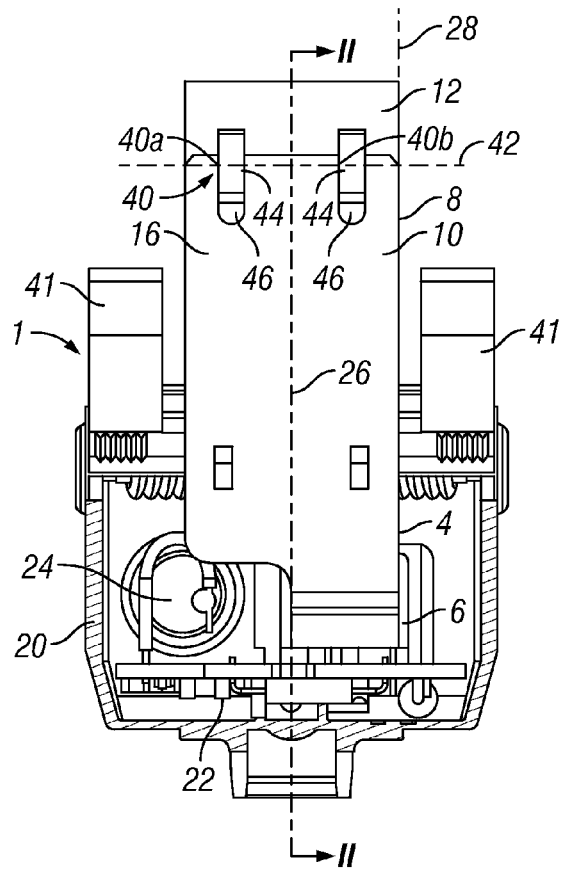
FIG. 1 shows a partially sectioned side view of a short-circuit indicator according to the invention.

Identical parts are always provided with the same reference symbols in the various figures of the drawings.

A short-circuit indicator 1 according to the invention is designed to be directly arranged to be roughly adjacent to or on an electrical line 2 (illustrated in FIG. 2) in order to detect a short-circuit current occurring in the line 2, and to indicate this occurrence qualitatively (not quantitatively) as a short-circuit. The line 2 is a line as normally used for electrical power distribution in a supply system, in particular an overhead line or a cable. The short-circuit indicator 1 has a current transformer 4 (in this context see also the separate illustrations in FIGS. 4 to 7), which comprises an induction coil 6 and an iron yoke 8 to surround the line 2. The iron yoke 8 comprises a first yoke part 10 and a second yoke part 12 in order to allow the short-circuit indicator 1 with the iron yoke 8 to be fitted to the line 2, and to be removed from it. The first yoke part 10 is U-shaped and comprises a base web 14 and two opposite U-limbs 16, 18. In this case, the induction coil 6 is seated on the base web 14. In this context, reference is made in particular to the section views in FIGS. 2, 3 and 7. The second yoke part 12 is connected in the form of a joint such that it can move between a closed position (FIGS. 1 to 7) and an open position (see FIGS. 8 and 9) to one U-limb 16 of the first yoke part 10. This will be explained in more detail further below. In its closed position, the second yoke part 12 forms a magnetic return path element for the first yoke part 10.

According to the invention, the first yoke part 10 is now split in the area of the base web 14 to which the induction coil 6 is fitted, such that the U-shaped first yoke part 10 effectively comprises two L-shaped parts 10a and 10b. The L-limbs 14a and 14b of these L-parts 10a and 10b then jointly form the base web 14 of the first yoke part 10. In this case, the limbs 14a, 14b are preferably parallel to one another over virtually their entire length. As can easily be seen, for example, from FIGS. 2 and 7, the assembly of the induction coil 6 is very simple since all that is necessary is to insert the limbs 14a and 14b of the L-parts 10a and 10b into the prefabricated induction coils 6 from opposite sides.

The current transformer 4, together with the area of the induction coil 6 and sub areas of the iron yoke 8, to be precise the U-limbs 16, 18 of the first yoke part 10, is held by a housing 20. An electronic evaluation circuit 22 is arranged within the housing 20 and is electrically connected to the induction coils 6. A battery 24 is preferably provided for supplying electrical power, and is likewise accommodated within the housing 20. The rest of the area of the iron yoke 8 with the free ends of the U-limbs 16, 18 of the first yoke part 10 and with the second yoke part 12 which is connected in the form of a moving joint projects out of the housing 20 in order to allow the line 2 to be accommodated.

Figure 12:
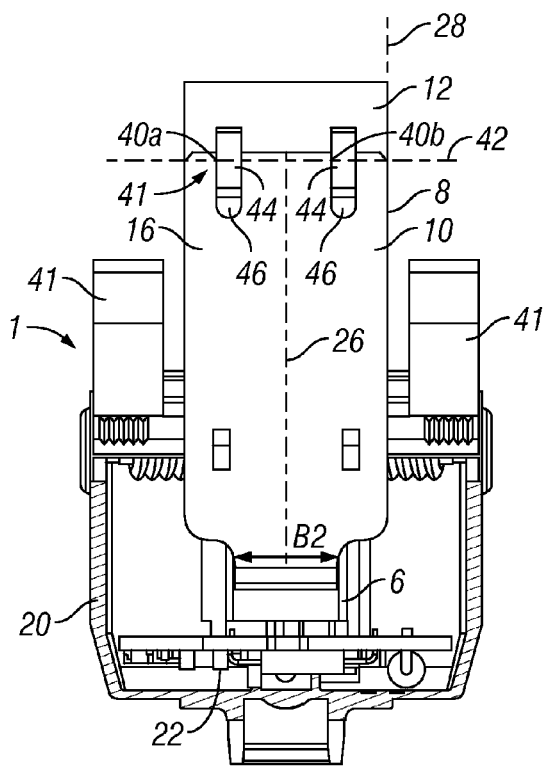
FIG. 12 shows a partially sectioned side view of an alternative embodiment of the short-circuit indicator of FIG. 1, the alternative embodiment illustrating the reduced width (B2) being formed symmetrically with respect to a center plane (26).

In a further major aspect of the invention, which can be provided in addition or else as an alternative to the two-part first yoke part 10 according to the invention, the base web 14, to which the induction coil 6 is fitted, of the first yoke part 10 which comprises a flat iron bar in the form of a strip has a width B2 which is less than the width B1 of the adjacent U-limbs 16, 18. In this context, reference is made to the illustrations in FIGS. 3, 8 and 9. In this case, the base web 14 with the reduced width B2 can, in an embodiment as shown in FIG. 12, be formed or arranged symmetrically with respect to a centre plane 26 defined by the U-limbs 16, 18 resulting in space being gained on both sides of the induction coil 6 within the housing 4, which can be used to accommodate components.

Figure 3:
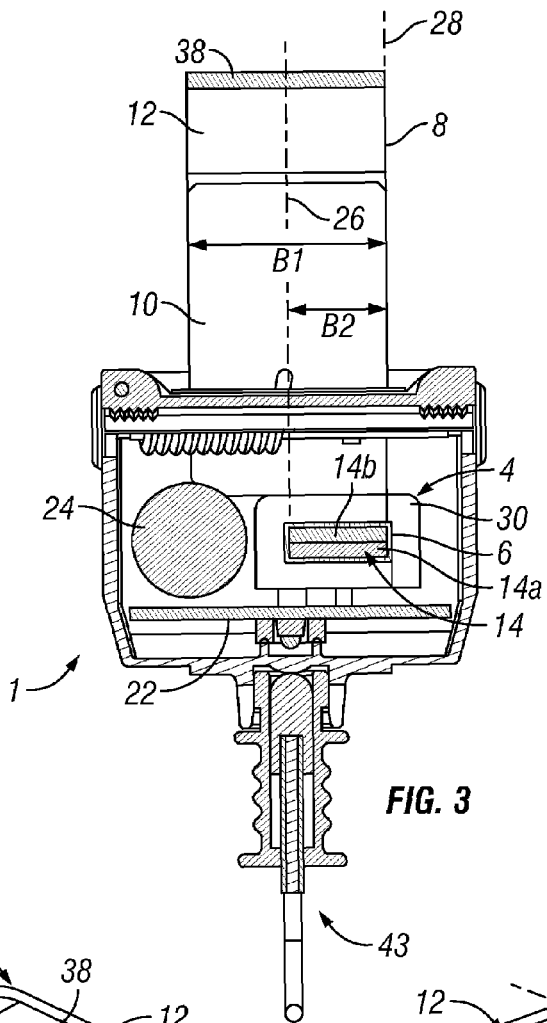
FIG. 3 shows a cross section along the plane III-III in FIG. 2.

However, the illustrated particularly advantageous embodiment provides for the base web 14 with the reduced width B2 to be formed asymmetrically with respect to the centre plan 26, to be precise preferably such that the U-limbs 16, 18 and the base web 14 each have one side edge in a common side plane 28 (see FIGS. 1 and 3). The reduced width B2 in this case preferably corresponds approximately to half the width B1 of the U-limbs 16, 18. This means that space is gained within the housing 20 on only one side alongside the induction coil 6, but that this space is very much greater than in the case of a symmetrical configuration. This greater gain in space is used to accommodate relatively large components, in particular including the battery 24, whose axis is then parallel alongside the elongated induction coil 6, with an elongated, cylindrical shape.

Figure 2:
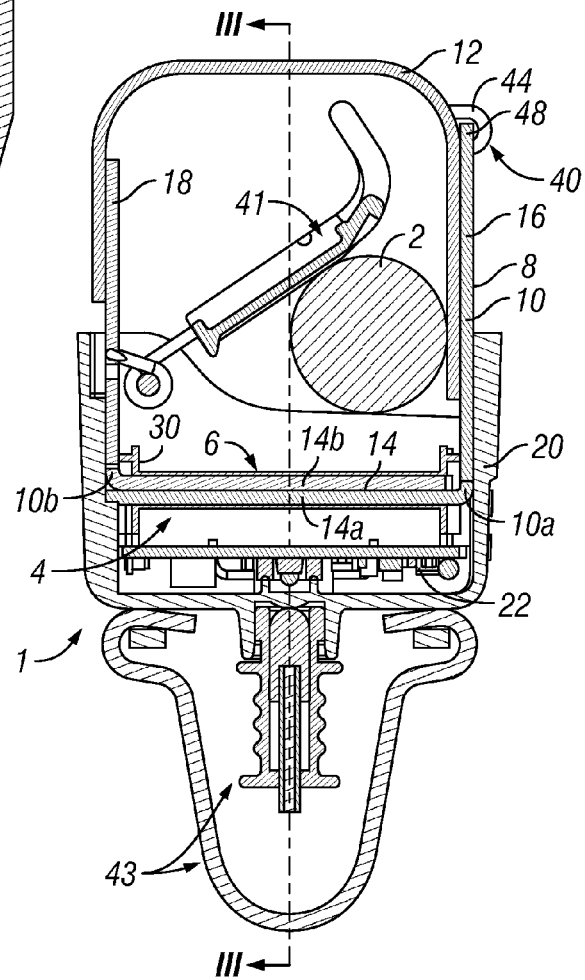
FIG. 2 shows a cross section along the plane II-II in FIG. 1 with the short-circuit indicator arranged on a line, and with additionally illustrated holding elements.
Figure 7:
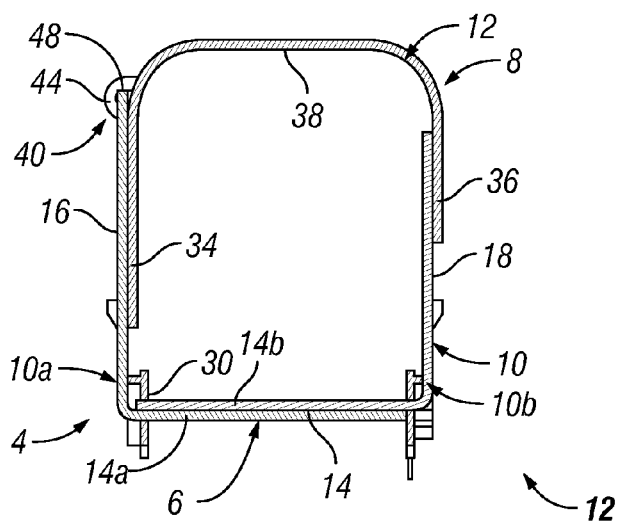
FIG. 7 shows a section along the plane VII-VII in FIG. 6.

As can best be seen in FIGS. 2 and 7, the induction coil 6 has a coil former 30 which, in particular, is prefabricated from a plastic moulding and has an axial through-opening, whose internal cross section corresponds approximately to the cross section of the base web 14, or of the L-webs 14a, 14b which rest flat on one another, of the first yoke part 10. The coil former 30 can also be wound in a simple manner using winding wire, when it is still separated from the iron yoke 8.

Figure 4:
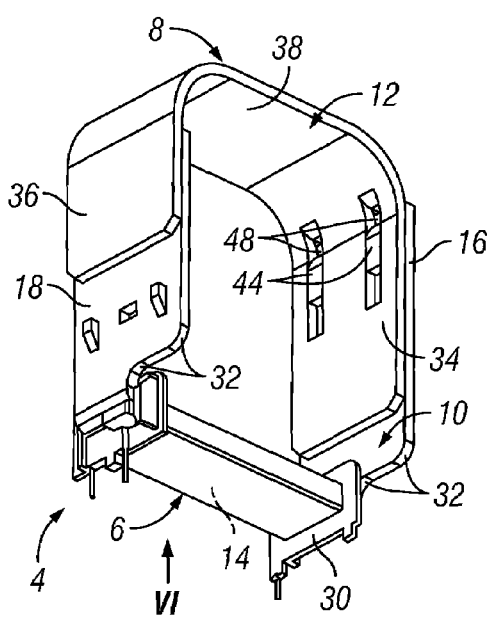
FIG. 4 shows a separate perspective illustration of a current transformer according to the invention.
Figure 5:
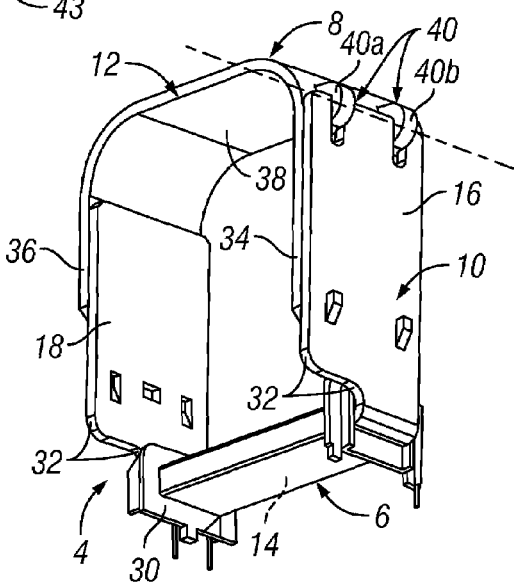
FIG. 5 shows a further perspective view of the current transformer, viewed from a different direction.
Figure 6:
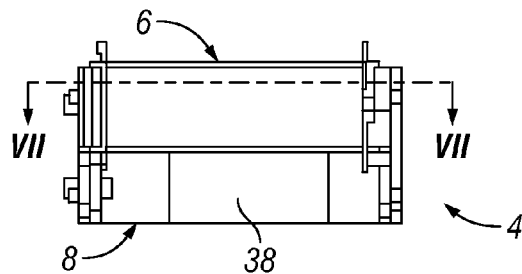
FIG. 6 shows a view of the underneath (coil side) of the current transformer, rotated on the plane of the drawing.
Figure 8:
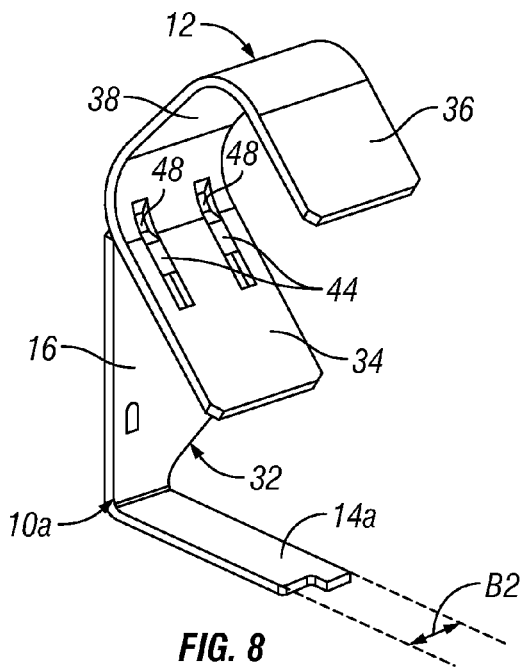
FIG. 8 shows a separate perspective view of a part of the first yoke part, together with the second yoke part, mounted such that it can pivot.
Figure 9:
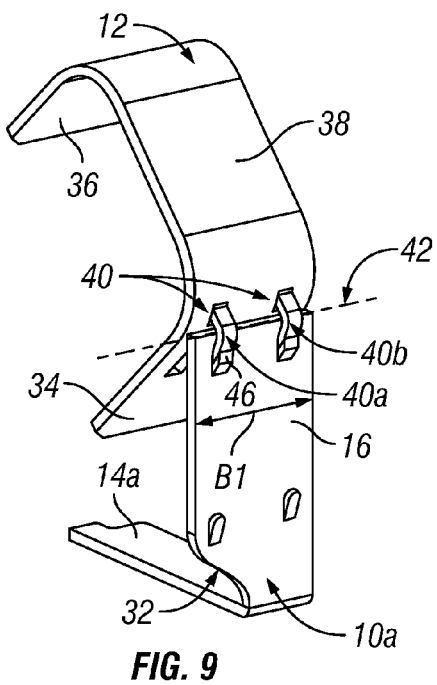
FIG. 9 shows a further perspective view, similar to FIG. 8, but viewed from a different direction.
Figure 10:
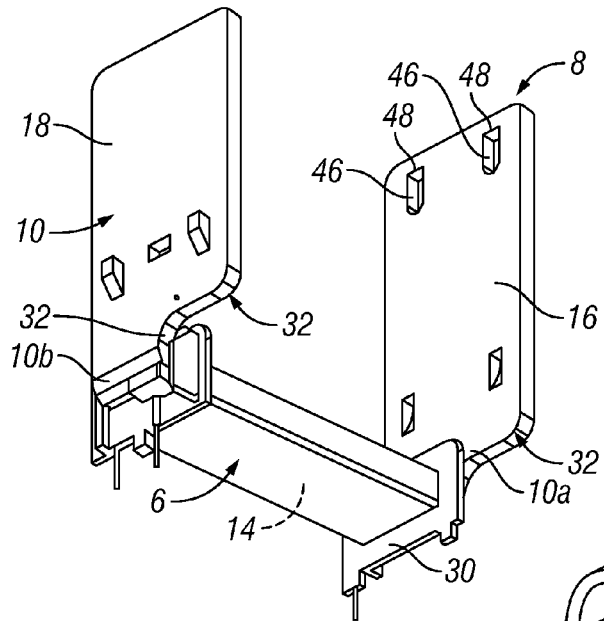
FIG. 10 shows a perspective view of only the first yoke part.

As shown in FIGS. 4 and 5 as well as FIGS. 8 to 10, it is advantageous for the first yoke part 10 to have an edge contour 32 which is matched to the profile of the magnetic lines of force, in particular of rounded edge contour 32 in the transitional areas between the narrower base web 14 and each of the L-limbs 14a, 14b and the respectively adjacent, broader U-limbs 16, 18. With regard to the base web 14 with the reduced width B2, it is magnetically advantageous for the two L-limbs 14a and 14b which rest flat on one another to have twice the thickness, and therefore a larger cross section overall. The described refinement therefore advantageously avoids any magnetic constriction (so-called isthmus) in the magnetic circuit.

In one advantageous refinement, the second yoke part 12 also comprises a flat iron bar in the form of a strip with a width which corresponds to the width B1 of the U-limbs 16, 18 of the first yoke part 10. Furthermore, in the illustrated example, the second yoke part 12 is also U-shaped with two limbs 34, 36 and a web 38 connecting the limbs. In addition, in this case, the second yoke part 12 is connected via a joint 40 to the free end of the U-limb 16 of the first yoke part 10 in the transitional area from the first limb 34 to the web 38. This refinement results in the limb 34 of the second yoke part 12, when in its open position—in this context see FIGS. 8 and 9—projecting into the line holding area formed by the first yoke part 10. When being fitted to the line 2, this limb 34 of the second yoke part 12 then comes to rest on the line 2 so that as it is fitted further over this limb 34, which is resting on the line 2, this results in an automatic pivoting movement of the second yoke part 12 to its closed position (see for example FIG. 7). The line 2 is then pressed via additional contact-pressure elements 41 (see FIG. 2 in this context), which are arranged in particular on both sides alongside the iron yoke 8, by spring force against the second yoke part 12 or its limb 34 such that the second yoke part 12 is held in its closed position. It can be opened from the closed position as illustrated in FIG. 2 simply by pulling the entire short-circuit indicator 1 off the line 2 against the contact-pressure element 41, to which spring force is applied. For handling purposes, on its lower face opposite the iron yoke 8, the housing 20 has suitable holding means 43, for example in the form of a wire clip, which are used to act on a switching rod, which is not illustrated.

It should be noted that the second yoke part 12 may also have a C-shaped configuration with an approximately semicircular profile or with a profile of more than a semicircle. This is advantageous in particular for conductors with a large cross section/diameter.

In the illustrated, particularly advantageous refinement, the joint 40 is formed exclusively by uniform-material sections of the yoke parts 10, 12. This means that there is no need for a separate joint element such as a hinge, to be prefabricated separately.

Figure 11:
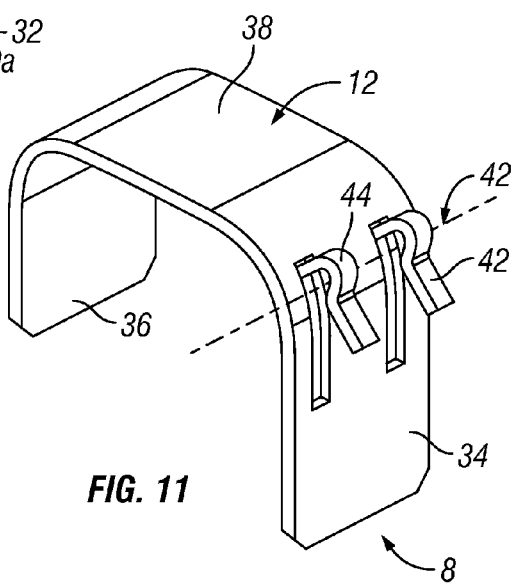
FIG. 11 shows a perspective view of the second yoke part.

As can be seen in particular from FIGS. 1, 5 and 9 the joint 40 comprises two hinge elements 40a and 40b, separated in the direction of a pivoting axis 42. As can also be seen in addition to this from FIG. 11, each hinge element 40a, 40b comprises a material section 44, which is stamped out of the flat iron bar of the one yoke part, in the illustrated example of the second yoke part 12 and is bent as a hinge holder, and a material web 48, which is formed by a hole opening 46 close to the edge, of the other yoke part, in the illustrated example of the first yoke part 10 in the free end area of the first U-limb 16. In this case the material web 48 is seated, as a hinge pin, in the hinge holder formed by the curved material section 44.

Finally it should also be noted that the invention relates not only to the entire short-circuit indicator 1 but also to its major components, in particular the current transformer 4 and the iron yoke 8 in the respectively described refinements according to the invention.

The invention is not restricted to the illustrated and described exemplary embodiments but also covers all embodiments with the same effect within the meaning of the invention. Furthermore, the invention is also not restricted to the feature combination defined in the respective independent claim, but can also be defined by any other combination of specific features of all of the individual features disclosed overall. This means that, in principle, virtually any individual feature of the respective independent claim can be omitted or can be replaced by at least one individual feature disclosed elsewhere in the application. To this extent, the claims should be regarded only as a first attempt at wording for an invention.

The invention claimed is:

1. A short-circuit indicator (1) for arrangement on an electrical line (2) for electrical power distribution, comprising:

a current transformer (4) having an induction coil (6) and an iron yoke (8) for surrounding the electrical line (2) to be monitored for a short-circuit current;

said iron yoke being formed of a first yoke part (10) and a second yoke part (12), said first yoke part having a U-shaped configuration and being formed of a base web (14) and two opposite U-limbs (16, 18);

said induction coil (6) being seated on said base web (14) of said U-shaped first yoke part (10);

said second yoke part (12) being connected in the form of a joint which can move between a closed position and an open position to one of said two opposite U-limbs (16, 18) of said first yoke part (10);

said second yoke part (12) forming a magnetic return path element for said first yoke part (10) in the closed position;

said first yoke part (10) being split into two essentially L-shaped parts (10a, 10b) in the area of said base web (14) to which said induction coil (6) is fitted;

said second yoke part (12) having one of U-shaped and C-shaped configurations and being formed of two limbs (34, 36) and a web (38) connecting said two limbs (34, 36), said second yoke part (12) being connected by a joint (40) to the free end area of said U-limb (16) of said first yoke part (10) in the transitional area between said web (38) and one of said adjacent limbs (34, 36); and said joint (40) being formed exclusively by uniform-material sections of said first and second yoke parts (10, 12) without any additional separate hinge parts.

2. A short-circuit indicator as claimed in claim 1, wherein said L-shaped parts (10a, 10b) of said first yoke part (10) each has a L-limb (14a, 14b) which engages in said induction coil (6) from opposite sides, said two L-limbs (14a, 14b) preferably resting on one another, parallel, over virtually their entire length in order to form said base web (14) of said first yoke part (10).

3. A short-circuit indicator as claimed in claim 1 wherein said first yoke part (10) includes a flat iron bar in the form of a strip, with said base web (14), to which said induction coil (6) is fitted, preferably having a width (B2) which is less than the width (B1) of said adjacent U-limbs (16, 18).

4. A short-circuit indicator as claimed in claim 3, wherein said base web (14) with the reduced width (B2) is formed symmetrically with respect to a centre plane (26) defined by said U-limbs (16, 18).

5. A short-circuit indicator as claimed in claim 3, wherein said base web (14) with the reduced width (B2) is formed asymmetrically with respect to a centre plane (26) defined by said U-limbs (16, 18), to be precise preferably such that said U-limbs (16, 18) and said base web (14) each have a side edge lying on a common side plane (28).

6. A short-circuit indicator as claimed in claim 1, wherein said induction coil (6) has a coil former (30) which is composed in particular of a plastic moulding and has an axial through-opening whose internal cross section corresponds approximately to the cross section of said base web (14) and of said L-limbs (14a, 14b) which rest flat on one another.

7. A short-circuit indicator as claimed in claim 3, wherein said first yoke part (10) has an edge contour (32), which is matched to the profile of the magnetic lines of force, in transitional areas between said narrower base web (14) and said adjacent, broader U-limbs (16, 18).

8. A short-circuit indicator as claimed in claim 1, wherein said second yoke part (12) includes a flat iron bar in the form of a strip with a width (B1) which corresponds to the width (B1) of said U-limbs (16, 18) of said first yoke part (10).

9. A short-circuit indicator as claimed in claim 1, wherein said joint (40) includes two hinge elements (40a, 40b) which are separated in the direction of a pivoting axis (42), each of said hinge element (40a, 40b) having a material section (44), which is stamped out of the flat iron bar of one yoke part (12) and is bent as a hinge holder, and a material web (48), formed by a hole opening (46) close to the edge, of the other yoke part (10), said material web (48) being seated as a hinge shaft in the hinge holder formed by the curved material section (44).

10. A current transformer (4) for use in a short-circuit indicator (1), comprising:
   an induction coil (6) and an iron yoke (8) for surrounding an electrical line (2) to be monitored for a short-circuit current;
   said iron yoke being formed of a first yoke part (10) and a second yoke part (12), said first yoke part having a U-shaped configuration and being formed of a base web (14) and two opposite U-limbs (16, 18);
   said induction coil (6) being seated on said base web (14) of said U-shaped first yoke part (10);
   said second yoke part (12) being connected in the form of a joint which can move between a closed position and an open position to one of said two opposite U-limbs (16, 18) of said first yoke part (10);
   said second yoke part (12) forming a magnetic return path element for said first yoke part (10) in the closed position;
   said first yoke part (10) being split into two essentially L-shaped parts (10a, 10b) in the area of said base web (14) to which said induction coil (6) is fitted;
   said second yoke part (12) having one of U-shaped and C-shaped configurations and being formed of two limbs (34, 36) and a web (38) connecting said two limbs (34, 36), said second yoke part (12) being connected by a joint (40) to the free end area of said U-limb (16) of said first yoke part (10) in the transitional area between said web (38) and one of said adjacent limbs (34, 36); and
   said joint (40) being formed exclusively by uniform-material sections of said first and second yoke parts (10, 12) without any additional separate hinge parts.

11. A current transformer as claimed in claim 10, wherein said L-shaped parts (10a, 10b) of said first yoke part (10) each has a L-limb (14a, 14b) which engages in said induction coil (6) from opposite sides, said two L-limbs (14a, 14b) preferably resting on one another, parallel, over virtually their entire length in order to form said base web (14) of said first yoke part (10).

12. A current transformer as claimed in claim 10, wherein said first yoke part (10) includes a flat iron bar in the form of a strip, with said base web (14), to which said induction coil (6) is fitted, preferably having a width (B2) which is less than the width (B1) of said adjacent U-limbs (16, 18).

13. A current transformer as claimed in claim 12, wherein said base web (14) with the reduced width (B2) is formed symmetrically with respect to a centre plane (26) defined by said U-limbs (16, 18).

14. A current transformer as claimed in claim 12, wherein said base web (14) with the reduced width (B2) is formed asymmetrically with respect to a centre plane (26) defined by said U-limbs (16, 18), to be precise preferably such that said U-limbs (16, 18) and said base web (14) each have a side edge lying on a common side plane(28).

15. A current transformer as claimed in claim 10, wherein said induction coil (6) has a coil former (30) which is composed in particular of a plastic moulding and has an axial through-opening whose internal cross section corresponds approximately to the cross section of said base web (14) and of said L-limbs (14a, 14b) which rest flat on one another.

16. A current transformer as claimed in claim 12, wherein said first yoke part (10) has an edge contour (32), which is matched to the profile of the magnetic lines of force, in transitional areas between said narrower base web (14) and said adjacent, broader U-limbs (16, 18).

17. A current transformer as claimed in claim 10, wherein said second yoke part (12) includes a flat iron bar in the form of a strip with a width (B1) which corresponds to the width (B1) of said U-limbs (16, 18) of said first yoke part (10).

18. A current transformer as claimed in claim 10, wherein said joint (40) includes two hinge elements (40a, 40b) which are separated in the direction of a pivoting axis (42), each of said hinge element (40a, 40b) having a material section (44), which is stamped out of the flat iron bar of one yoke part (12) and is bent as a hinge holder, and a material web (48), formed by a hole opening (46) close to the edge, of the other yoke part (10), said material web (48) being seated as a hinge shaft in the hinge holder formed by the curved material section (44).

19. An iron yoke (8) for use in a current transformer (4), comprising:
   a first yoke part (10);
   a second yoke part (12), said first yoke part having a U-shaped configuration and being formed of a base web (14) and two opposite U-limbs (16, 18);
   an induction coil (6) being seated on said base web (14) of said U-shaped first yoke part (10);
   said second yoke part (12) being connected in the form of a joint which can move between a closed position and an open position to one of said two opposite U-limbs (16, 18) of said first yoke part (10);
   said second yoke part (12) forming a magnetic return path element for said first yoke part (10) in the closed position; and
   said first yoke part (10) being split into two essentially L-shaped parts (10aa, 10b) in the area of said base web (14) to which said induction coil (6) is fitted;
   said second yoke part (12) having one of U-shaped and C-shaped configurations and being formed of two limbs (34, 36) and a web (38) connecting said two limbs (34, 36), said second yoke part (12) being connected by a joint (40) to the free end area of said U-limb (16) of said first yoke part (10) in the transitional area between said web (38) and one of said adjacent limbs (34, 36); and
   said joint (40) being formed exclusively by uniform-material sections of said first and second yoke parts (10, 12) without any additional separate hinge parts.

* * * * *